(12) United States Patent
Hofmann (10) Patent No.: US 9,022,098 B2
(45) Date of Patent: May 5, 2015

(54) MULTISTAGE HEAT EXCHANGING DUCT COMPRISING A PARALLEL CONDUIT

(75) Inventor: Wilfried Hofmann, München (DE)

(73) Assignee: NFT Nanofiltertechnik Gesellschaft mit beschrankter Haftung, Bad Homburg (DE)

( * ) Notice: Subject to any disclaimer, the term of this patent is extended or adjusted under 35 U.S.C. 154(b) by 1485 days.

(21) Appl. No.: 12/297,698

(22) PCT Filed: Apr. 19, 2007

(86) PCT No.: PCT/EP2007/003444

§ 371 (c)(1),
(2), (4) Date: Oct. 20, 2008

(87) PCT Pub. No.: WO2007/121925

PCT Pub. Date: Nov. 1, 2007

(65) Prior Publication Data

US 2009/0101313 A1 Apr. 23, 2009

(30) Foreign Application Priority Data

Apr. 20, 2006 (DE) .......................... 10 2006 018 709
Jul. 27, 2006 (DE) .......................... 10 2006 035 552

(51) Int. Cl.
*H05K 7/20* (2006.01)
*H01L 23/467* (2006.01)
(Continued)

(52) U.S. Cl.
CPC ................ *H01L 23/467* (2013.01); *F28D 1/06* (2013.01); *F28D 2021/0031* (2013.01); *F28F 3/12* (2013.01); *H05K 7/206* (2013.01); *F28F 2009/228* (2013.01); *H01L 2924/0002* (2013.01)

(58) Field of Classification Search
USPC ........ 165/80.3, 103, 139, 146, 147, 167, 172, 165/177, 178, 121; 361/695
See application file for complete search history.

(56) References Cited

U.S. PATENT DOCUMENTS 4,222,373 A 9/1980 Davis
4,257,398 A 3/1981 Watson
(Continued)

FOREIGN PATENT DOCUMENTS

DE 10233736 4/2004
DE 102004030675 11/2005
(Continued)

OTHER PUBLICATIONS

International Search Report, PCT/EP2007/003444, dated Sep. 4, 2007, 6 pages.
(Continued)

*Primary Examiner* — Leonard R Leo
(74) *Attorney, Agent, or Firm* — Senniger Powers LLP (57) ABSTRACT

The heat exchanger having a heat exchanging channel (11, 21, 31) comprises an inlet (9) and an outlet (33) for a medium flowing through the heat exchanging channel. The heat exchanger has at least two stages (10, 20, 30) being arranged one after the other in view to the flowing direction of the medium, each stage having a heat exchanging channel (11, 21, 31). The first stage has at least one guiding channel (12) arranged parallel to the heat exchanging channel (11). The heat exchanging channel (11, 21, 31) has at the end of the respective stage (10, 20, 30) at least one outlet (13, 23, 33) and the guiding channel (12, 22) of the respective stage is connected with the heat exchanging channel (21, 31) of the next following stage (20, 30). By this unused heat transfer medium is fed to each stage, said heat transfer medium having a higher temperature difference with respect to the respective heat exchanging channel. By this a good heat transfer efficiency is realized even with relatively long flow pathes.

25 Claims, 6 Drawing Sheets

(51) Int. Cl.
*F28D 1/06* (2006.01)
*F28F 3/12* (2006.01)
*F28D 21/00* (2006.01)
*F28F 9/22* (2006.01)

(56) References Cited

U.S. PATENT DOCUMENTS

| | | | | |
|---|---|---|---|---|
| 4,765,397 A | * | 8/1988 | Chrysler et al. | 165/104.33 |
| 5,063,475 A | * | 11/1991 | Balan | 361/679.49 |
| 5,077,603 A | * | 12/1991 | Macovski | 348/631 |
| 5,388,635 A | * | 2/1995 | Gruber et al. | 165/80.4 |
| 5,592,363 A | * | 1/1997 | Atarashi et al. | 361/689 |
| 6,105,661 A | * | 8/2000 | Torii | 165/80.4 |
| 6,154,368 A | * | 11/2000 | Scofield | 361/719 |
| 6,285,554 B1 | * | 9/2001 | Westberg | 361/719 |
| 6,364,009 B1 | * | 4/2002 | MacManus et al. | 165/185 |
| 6,400,568 B1 | * | 6/2002 | Kim et al. | 361/697 |
| 6,501,650 B2 | * | 12/2002 | McMenamin et al. | 361/695 |
| 6,721,180 B2 | * | 4/2004 | Le et al. | 361/695 |
| 6,765,796 B2 | | 7/2004 | Hoffman et al. | |
| 7,167,363 B1 | | 1/2007 | Cushman et al. | |
| 7,259,961 B2 | | 8/2007 | Lucero et al. | |
| 2001/0006101 A1 | * | 7/2001 | Chu et al. | 165/80.3 |
| 2003/0089490 A1 | * | 5/2003 | Song et al. | 165/121 |
| 2007/0215336 A1 | * | 9/2007 | Hsu | 165/185 |

FOREIGN PATENT DOCUMENTS

| | | |
|---|---|---|
| DE | 102006018709 | 10/2007 |
| EP | 1727411 | 11/2006 |
| JP | 53008765 | 1/1978 |
| JP | 2210898 A | 8/1990 |

OTHER PUBLICATIONS

Internationaler Vorläufiger Bericht über die Patentierbarkeit, PCT/EP2007/003444, Mar. 13, 2008, 6 pages.
Abstract of EP1727411; Nov. 29, 2006.
Abstract of DE102004030675; Nov. 10, 2005.
Abstract of DE10233736; Apr. 15, 2004.
Abstract of DE102006018709 ; Oct. 11, 2007.
Abstract of JP2210898: Aug. 22, 1990.

* cited by examiner

MULTISTAGE HEAT EXCHANGING DUCT COMPRISING A PARALLEL CONDUIT

CROSS-REFERENCE TO RELATED APPLICATIONS

This application claims priority from German application 10 2006 018 709.1, filed Apr. 20, 2006, now Patent DE 10 2006 018 709; and from German application DE 10 2006 035 552.0 filed Jul. 27, 2006, the entire disclosures of which are incorporated by reference.

FIELD OF THE INVENTION

The invention relates to a heat exchanger of the type having an inlet and an outlet and a channel through which a heat-exchanging medium flows.

BACKGROUND OF THE INVENTION

Such a heat exchanger is for example known from DE 10 2004 030 675 A1. For cooling of electronic components, which are arranged within a switch cabinet, there is formed a channel together with a wall of the switch cabinet, and a medium such as air flows through the channel. The channel has an inlet for cool air and an outlet for heated air. Cooling elements are arranged on a channel wall, which shall provide for a better heat transfer from that wall to the air flowing along it.

Heat exchangers having successively arranged stages where each stage is fed with fresh medium are known from US 2004/0256092 A1 and US 2002/0000311 A1.

Generally, the heat flow WF flowing along a surface A is proportional to the temperature difference $\Delta T$ between the fluid and the surface A. As a proportiona-lity constant $\alpha$ the heat transfer coefficient in [W/m$^2$*K] is chosen and therefore, it is valid:

$$WF=\alpha * A * \Delta T \qquad \text{i.}$$

The heat transfer coefficient $\alpha$ is dependent on material constants as well as from the aforementioned cooling elements, which for example provoke a turbulence.

From the above equation it can be seen that the cooling performance is proportional to the temperature difference $\Delta T$. Where the flow path of the cooling fluid is longer, the cooling fluid is heated such that the temperature difference along the flow path decreases and thereby the cooling performance decreases.

It is mentioned that analogous relationships are naturally valid for a heating, as for example a hot medium shall transmit heat to another object, as for example to a plate. If in the following the words cooling or cooling efficiency are used, the same is also true in an analogous manner for heating and heating efficiency.

As shown in the above mentioned prior art, it is often necessary to cool or heat elongated surfaces, wherein the problem of the decreasing cooling efficiency with increasing length arises.

A possibility for solving this problem is to increase the flow velocity of the fluid and therewith the flow rate of the fluid. This, however, requires greater dimensioned feeding devices for the fluid, thus for example greater dimensioned blowers, which causes higher driving energy and therewith mostly a higher electrical current consumption as well as an increased required space and finally also a higher noise emission.

SUMMARY OF THE INVENTION

Therefore, it is an object of the invention to improve the heat exchanger of the above-mentioned type in such a way that it has a good performance and simultaneously a small required space even with greater surfaces to be cooled or to be heated.

This object is solved by the features mentioned in the claims. Advantageous embodiments and further developments of the invention are shown in the subclaims.

The basic principle of the invention lies therein to realize the heat exchanger from at least two or more successively arranged stages, wherein to each stage a "fresh" medium is fed, while the "used" medium is discharged at the end of that stage.

Each stage, with the exception of the last stage, therefore has a heat exchanging channel and a guiding channel for "fresh" fluid, which within the respective stage does not take part on a heat exchange, wherein the heat exchange channel and the guiding channel are arranged parallel to each other. At the end of each stage the fluid of the heat exchange channel is discharged through outlet openings and "fresh" fluid of the guiding channel is fed to the heat exchanging channel of the next stage and, if required, to a further guiding channel of the next stage. Seen perpendicular to the flowing direction of the fluid, the fluid flows of used and fresh fluid are crossing each other, wherein both flows are separated from each other by guiding channels, which are denoted here as "cross flow elements".

The individual stages may be designed modular such that theoretically as many elements can be successively arranged after one another as desired.

Preferably, all heat exchanging channels of the individual stages are arranged within one plane, such that a simple geometrical structure is achieved, where the heat exchanging channel and the guiding channel each have the form of a cuboid. These channels also have a small flow resistance such that with a small dimensioned feeding device, as for example blowers, considerable volume flows and therewith also heat flows can be realised. According to a further development of the invention the outlet of the heat exchanging channel of the respective stage is designed such that at least a guiding plate is deflecting the fluid in a direction to at least one sidewall of the heat guiding channel, wherein the respective sidewall has an outlet opening there. Preferably, on both sidewalls of the respective heat exchanging channels such outlet openings are present, wherein according to a preferred embodiment of the invention the sum of the cross-sectional areas of the outlet openings correspond to the cross-sectional area of the heat exchanging channel.

The heat exchanger according to the invention has a small required space, in particular because of its small height with respect to a plane perpendicular to the flow direction and therefore allows its use on both sides of a surface, as for example a wall of a switch cabinet to be cooled. Nonetheless, the heat exchanger according to the invention uses only one fluid inlet. The incoming fluid is therewith divided within each stage into at least two branch flows, which are fed to different channels.

A thermal interaction between the fluid and the surface occurs on the separately ventilated areas of the surface within the heat exchanging channel, wherein preferably measurement for improving the heat transfer are used, as for example a rough surface, cooling ribs or micro ribs according to DE 102 33 736 B3 or similar.

The above mentioned cross flow elements do have the function to feed or discharge the fluid to or from the respective surface areas of the heat exchanging channel and the guiding channel.

BRIEF DESCRIPTION OF THE FIGURES

In the following the invention will be described in connection with an embodiment in more detail by referring to the attached drawings. It shows.

Same reference numbers of the individual figures refer to the same or functional related elements. Further, it is noted that the description of a heat exchanger having three stages is not limiting. It is only required that at least two stages are present whereas no upper limitation is given for a number of stages.

DETAILED DESCRIPTION OF PREFERRED EMBODIMENTS

Figure 1:
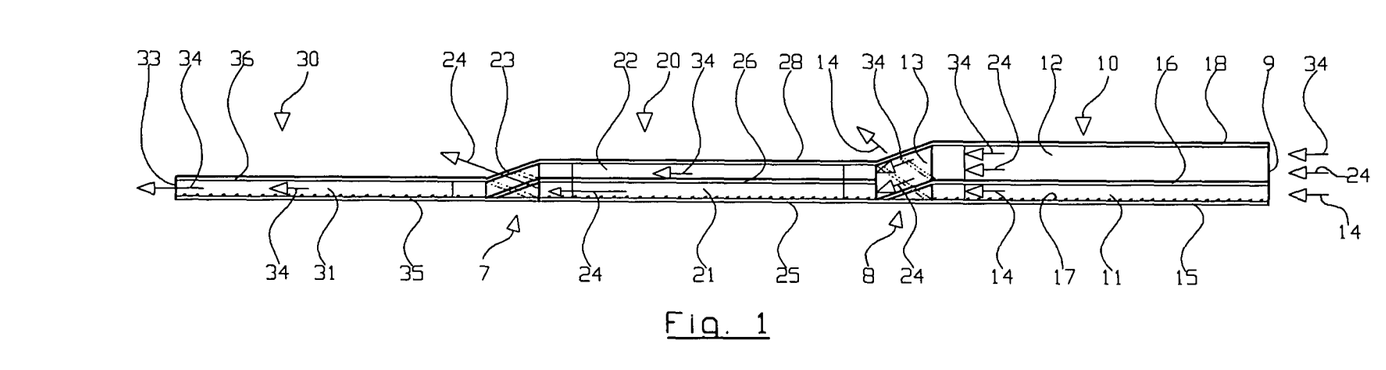
FIG. 1 A schematic cross-section of a heat exchanger having three stages according to an embodiment of the invention.

FIG. 1 shows a schematic side view of the heat exchanger, which here has three stages 10, 20 and 30. The first stage 10 has a heat exchanging channel 11, wherethrough a fluid, like for example air, may flow, namely with a first part flow 14, which is denoted by an arrow. The heat exchanging channel 11 has a heat transfer wall 15, which is in a heat transferring interaction with the part flow 14, wherein this wall 15 may comprise elements on its inner side, which improve a heat transfer, as for example cooling ribs, roughnesses or micro ribs according to DE 102 33 736 B3.

The heat exchange channel 11 further has a dividing wall 16, which separates the heat exchanging channel 11 from a guiding channel 12 lying thereabove. The guiding channel 12 is closed by a topwall 18. Both channels 11 and 12 are closed at their sides by common side walls 19 and 19a (compare FIG. 2). Both channels have a common inlet 9 for a fluid, which is separated by the dividing wall 16 into part flows at the inlet 9, namely a first part flow 14 flowing through the heat exchanging channel 11 and at least an additional part flow 24 and/or 34 flowing through the guiding channel 12 and therewith is not in a heat exchanging interaction with the heat exchanging channel 11 and the heat transfer wall 15.

At the downstream end of the first stage 10 a "cross flow element" 8 is arranged, which on the one hand connects the heat exchanging channel 11 with an outlet 13 by guiding plates; by the outlet 13 the first part flow 14 is discharged to atmosphere; on the other hand said cross flow element 8 is connecting the guiding channel 12 with the second stage 20 such that the part flows 24 and 34 are fed to the second stage 20. The part flows 14 on the one hand and 24 and 34 on the other hand are separated from each other by the guiding plates and therefore are not in a heat transferring interaction with each other.

Because the first part flow 14 was in an heat exchanging interaction within the heat exchanging channel 11, its medium is "used" and has only a small temperature difference ΔT with respect to the heat transfer wall 15, whereas the part flows 24 and 34 comprise "unused" medium, which still has a relatively high temperature difference ΔT with respect to the next following stages 20 and 30.

Referring to the view of FIG. 1 the first part flow 14 is discharged in direction to above via the opening of the outlet 13, whereas the part flows 24 and 34 are guided inclined to below, where they are divided within the second stage 20 by the separating wall 26, which is provided there. The second stage 20 has in an analogous manner a heat exchanging channel 21 and a guiding channel 22. The part flow 24 flows through the heat exchanging channel 21 and is in a heat exchanging interaction with a wall 25, whereas the part flow 34 within the guiding channel 22 is not in any heat exchanging interaction with the wall 25.

In an analogous manner there is again a cross-flow element 7 at the end of the second stage 20, said cross-flow element 7 connects again via guide plates the heat exchanging channel 21 with an opening 23 and the guiding channel 22 with a heat exchanging channel 31 of the third stage 30, which here is the last stage and which therefore does not need a guiding channel but only a topwall 36 and here a heat exchanging wall 35. At the outlet 33 of the third stage the used medium is discharged with a part flow 34.

Figure 2:
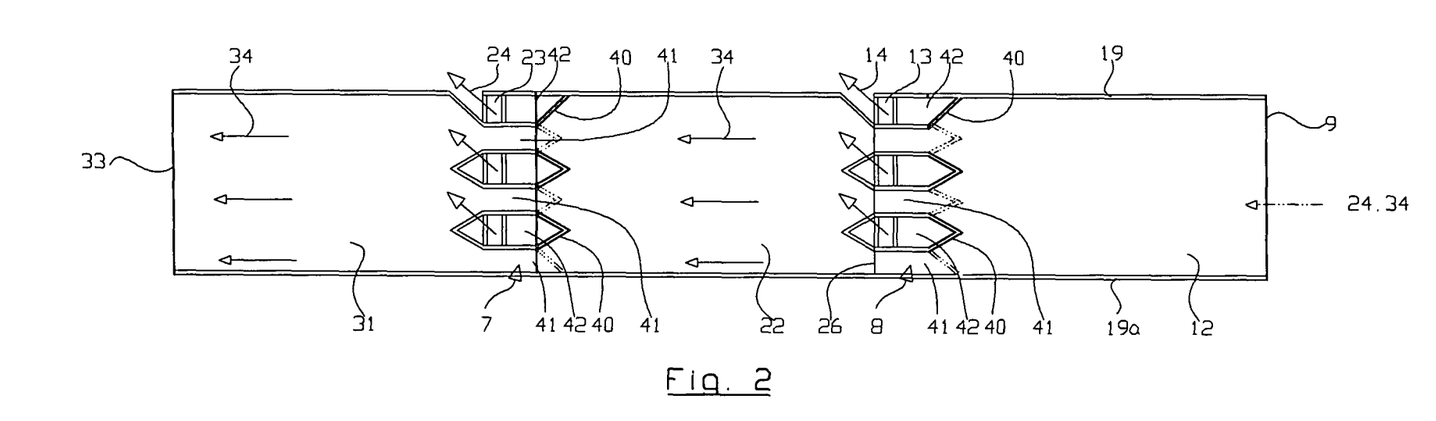
FIG. 2 A schematic top view of the heat exchanger of FIG. 1.

In FIG. 2 each top wall 18, 28 and 36 is omitted in order to show at both first stages 10 and 20 the inner part of the guiding channels 12 and 22 and on the third stage 30 the inner part of the heat exchanging channel 31. The cross-flow elements 7 and 8 are to be seen which in the respective upper plane of the guiding channels 12 and 22 do have guide plates 40, which are open into leadover channels 41; these leadover channels are inclined to below as seen in FIG. 1. In the transit area between the first stage 10 and the second stage 20 the separating wall 26 is to be seen, where the part flows 24 and 34 are separated.

Further, guiding plates are depicted by dotted lines. It refers to guiding plates of the lowest plane of the respective heat exchanging channels, which guide the fluid part flows into upwards directed discharge channels 42 leading to the outlets 13 and 23 respectively.

Figure 3:
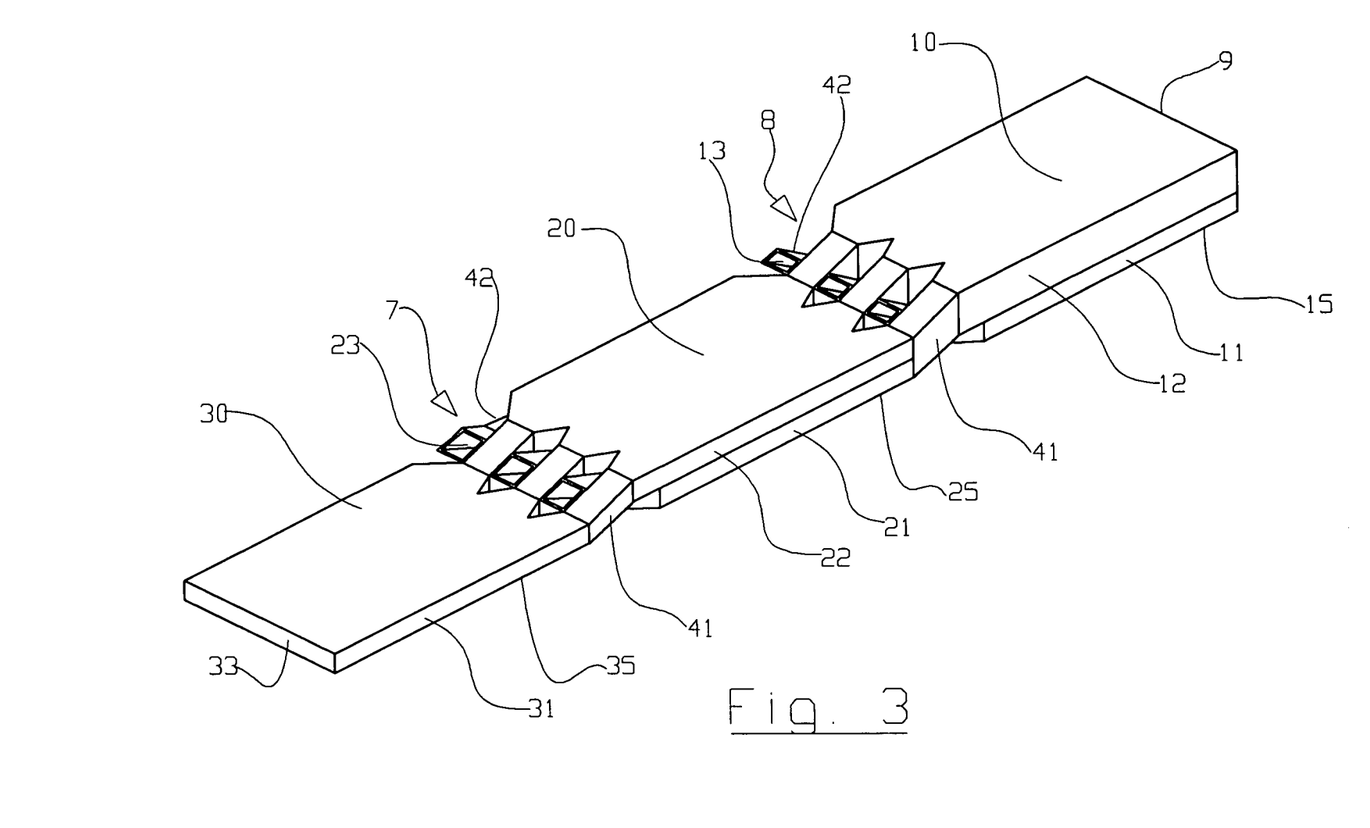
FIG. 3 A perspective view of the heat exchanger of FIGS. 1 and 2 seen inclined from above.

FIG. 3 shows the heat exchangers in FIGS. 1 and 2 in a perspective view seen inclined from above in a closed arrangement. The individual channels described above are to be seen here in a good manner.

In FIG. 1 the heat transfer walls 15, 25 and 35 are depicted as continuously made of one part. However, it is also possible, as shown in FIG. 3, to design these walls individually so that the connection between successively following stages is made only by the cross-flow elements 7 and 8.

In the embodiment of FIGS. 1 to 3 the heat exchanger has a single inlet 9 for the fluid but three outlets 13, 23 and 33 for the part flows 14, 24 and 34, said outlets being arranged one after another.

For some applications it is useful to have only one inlet and one outlet.

Figure 4:
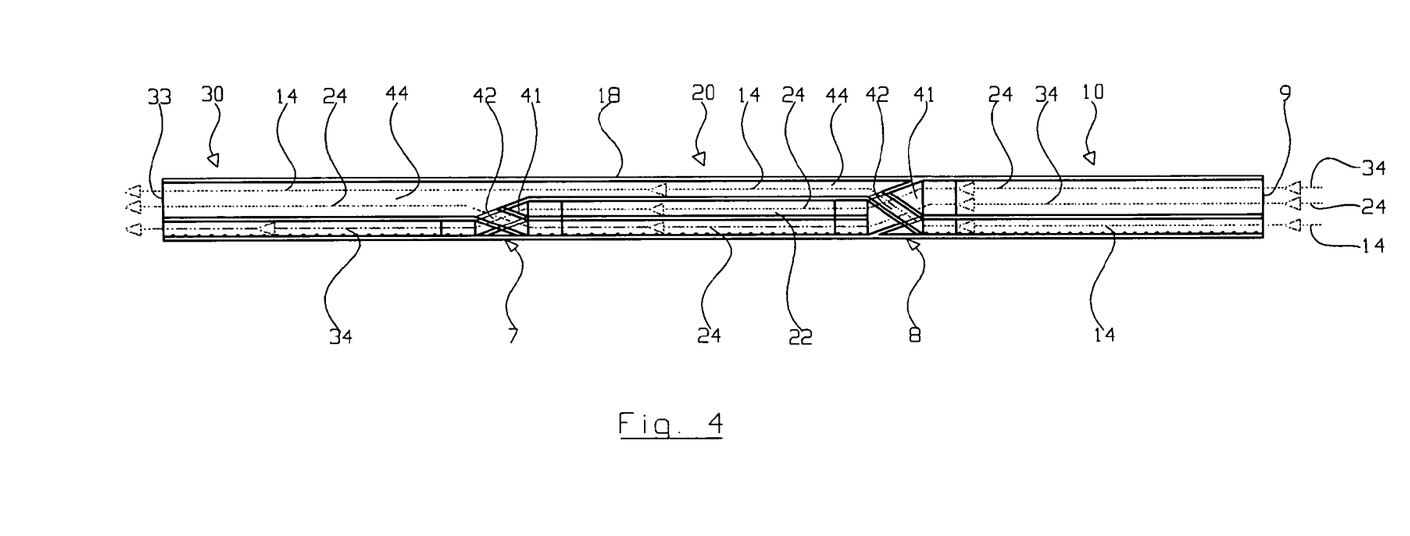
FIG. 4 A schematic side view of the heat exchanger similar to FIG. 1 but according to another variant of the invention.

To this purpose the top wall 18 of the first stage 10 is elongated over the whole heat exchanger of the variant of FIG. 4 such that for the second stage 20 above of its guiding channel 22 still an additional guiding channel 44 is provided, within which the part flow 14 is discharged and at the end of the second stage is joined with the part flow 24 such that overall only one outlet 33 is provided. It is evident that the outlets 13 and 23 of the embodiment of FIG. 1 lead into the guiding channel 44 in this embodiment.

The heat exchanger of the invention is mounted by a small number of simple basic elements, which can be combined in a manner of a kit in order to adapt the capacity of the heat efficiency to the individual application. The individual stages and the downstream cross-flow elements may be designed as a module, wherein modules for the first, second, third, fourth etc. stages are manufactured, which preferably may be coupled by a plug connection, wherein only the individual stages are to be plugged together and in some applications are connected additionally by for example adhesive bonding, soldering, welding or other known methods for connection. The individual basic elements are comprised by thin plates, which may be made of metal or plastics and which can be plugged into each other and/or which can be glued with each other. The heat exchanger therefore has a small weight and can be connected to a surface to be cooled or to be heated without substantial effort.

Generally, it is possible to omit the heat transfer wall 15, 25 and 35 and therefore a surface of an object to be cooled or to be heated forms the lower side of the individual heat exchanging channel. It is to be understood that the heat transfer walls 15, 25 and 35 are to be made from material which has good heat conducting properties.

According to the invention the individual stages 10, and 30 may be bent in order to adapt it to the contour of the object to be cooled or to be heated.

Figure 5:
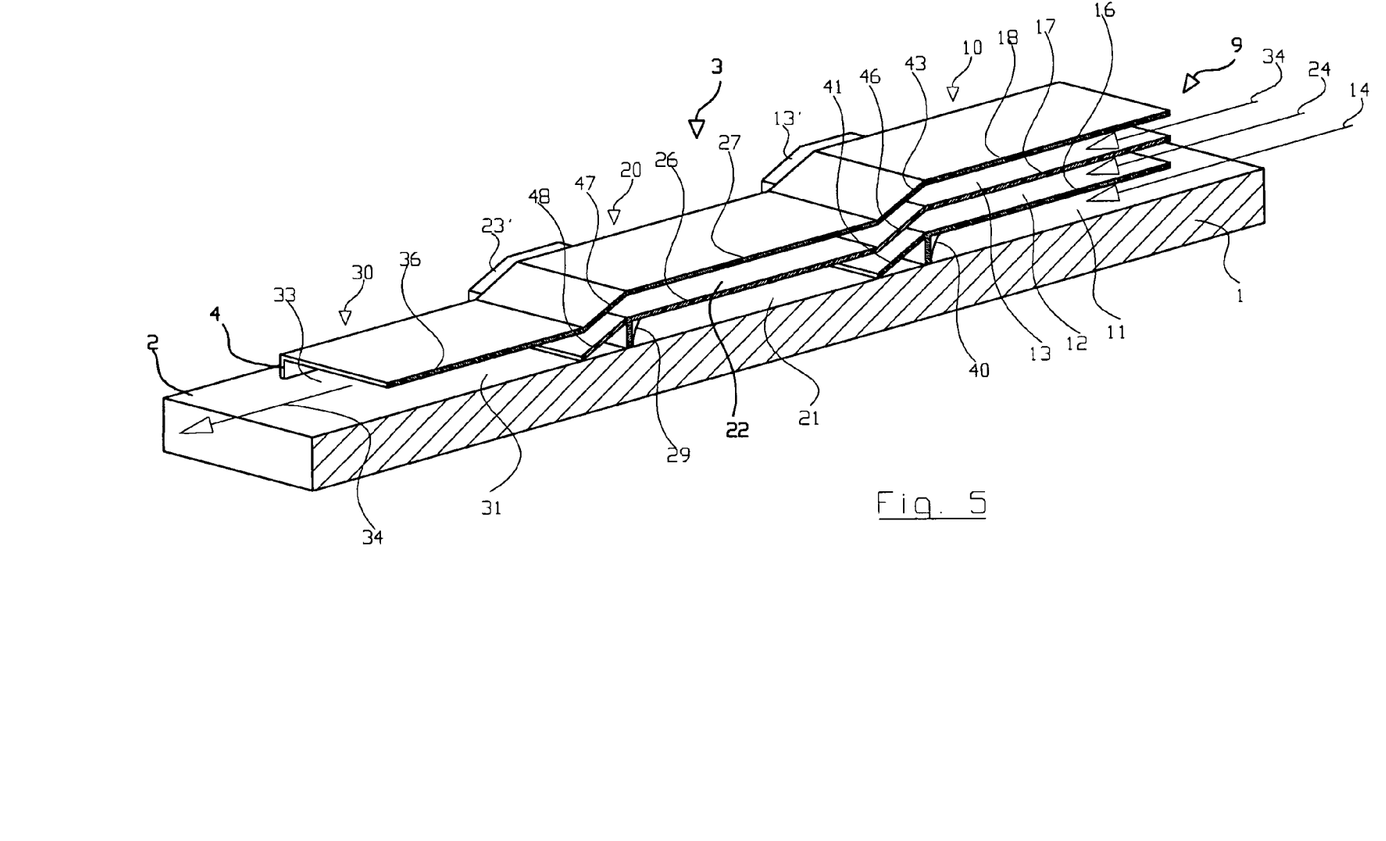
FIG. 5 A perspective sectional view seen inclined from above of a heat exchanger according to a further embodiment of the invention.
Figure 6:
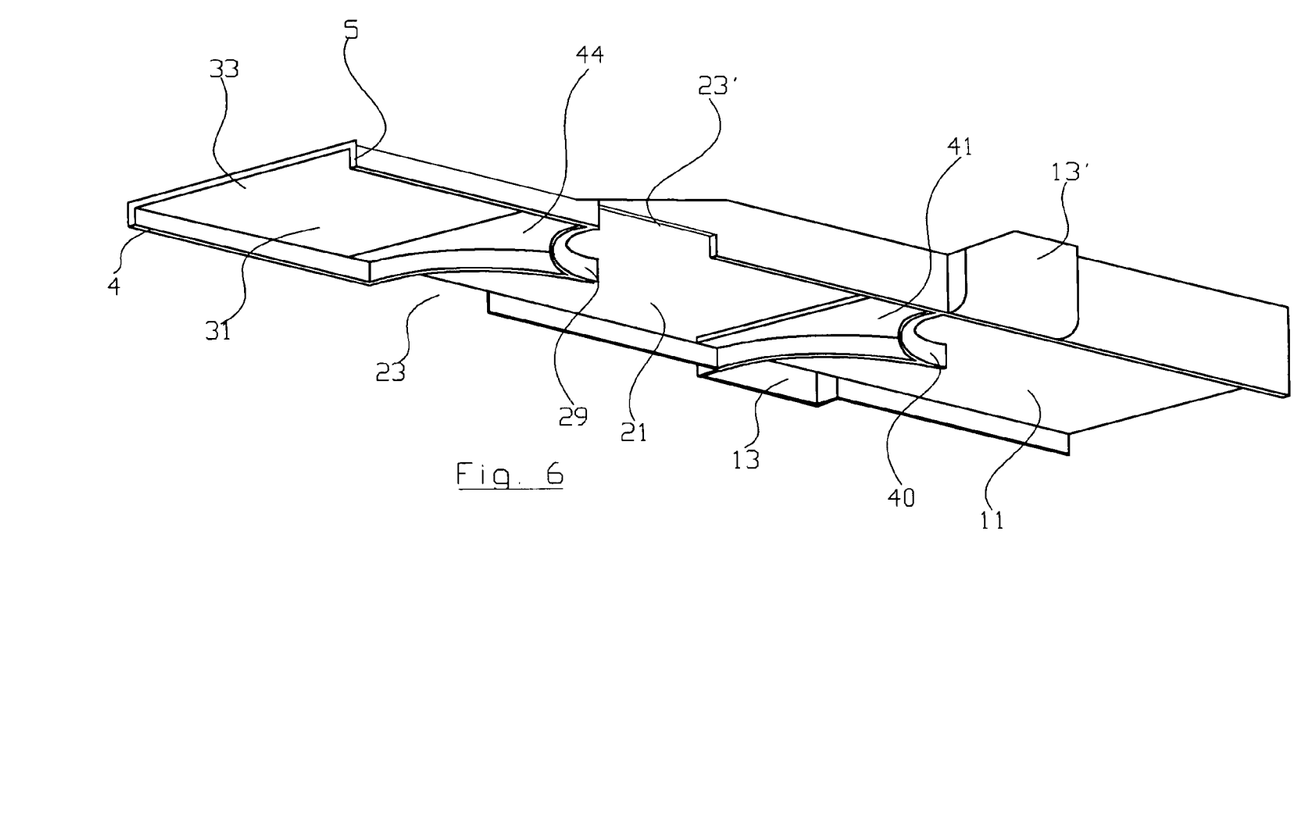
FIG. 6 A perspective view seen inclined from below of the heat exchanger of FIG. 5.
Figure 7:
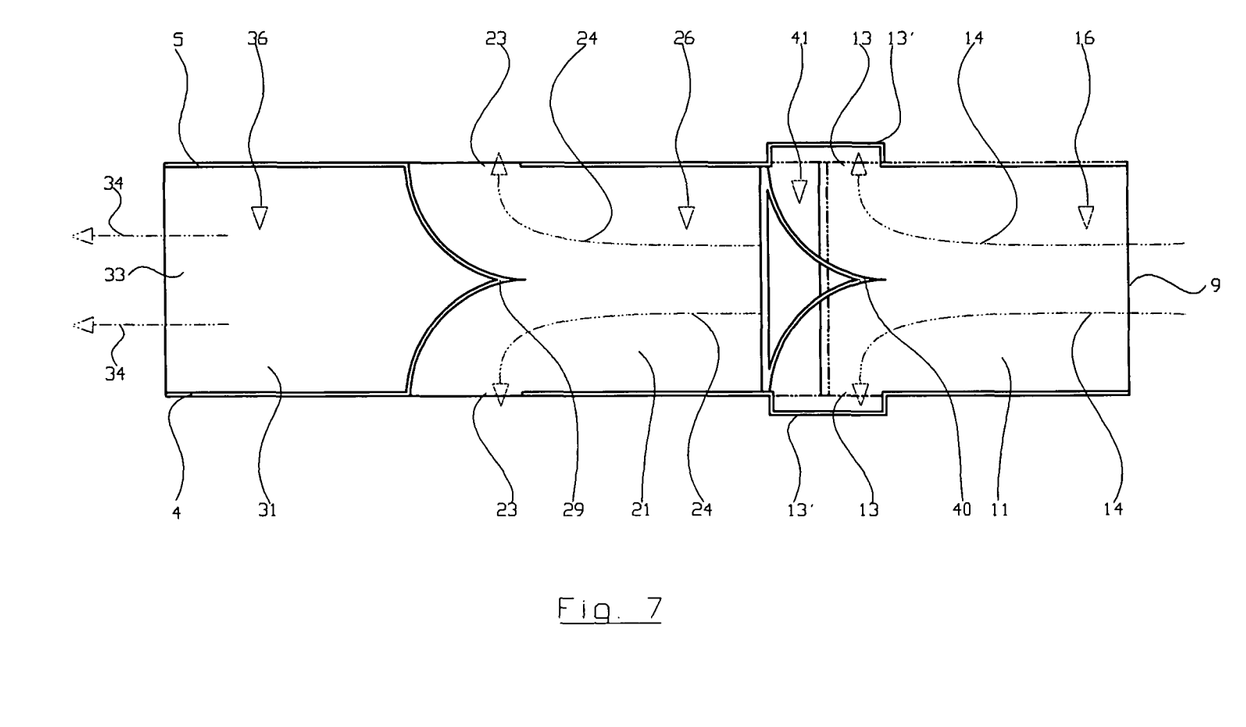
FIG. 7 A view of the lower side of the heat exchanger of FIGS. 5 and 6.

The FIGS. 5-7 show a second embodiment.

FIG. 5 shows an object 1 to be cooled or to be heated having a flat surface whereon the heat exchanger 3 is placed. The heat exchanger 3 has here again three stages 10, 20 and 30, which are arranged after each other in flowing direction of a heat transferring medium, as for example air. Each of the three stages 10, 20 and 30 has a heat exchanging channel 11, 21 and 31, respectively, which is limited here on the one hand by a planar surface 2 of the object 1, by sidewalls 4 and 5 (FIGS. 6 and 7) and a limiting wall 16, 26 and 36, wherein the limiting wall 36 of the last stage 30 has the function of a top wall.

The heat exchanger 3 is designed such that the medium fed to the individual stages 10, 20 and 30 and therewith to the individual heat exchanging channels 11, 21 and 31 is "fresh" medium and not a "used" medium, wherein the fresh medium has not taken part to a heat exchanging action within a preceding stage before reaching the respective heat exchanging channel.

The heat exchanger 3 has a common inlet 9 for the medium, which is here divided within the shown three staged heat exchanger into three part flows 14, 24 and 34, by arranging parallel to the limiting wall 16 of the first heat exchanging channel 11 two additional walls 17 and 18, which form together with the sidewalls 4 and 5 guiding channels 12 and 13 for the part flows 24 and 34, wherethrough the medium flows without taking part on the heat exchanging action of the first heat exchanging channel 11.

As best can be seen in FIG. 7, a guiding plate 40 is arranged within the first heat exchanging channel 11, said guiding plate 40 limits the rearmost side of the heat exchanging channel 11, with respect to the flow direction, by two curved brackets and guides the part flow 14 to openings 13 within the side walls 4 and 5.

By this, at the downstream end of the first exchanging channel the used medium then is discharged laterally, wherein the flow can be deflected to above, i.e. perpendicular to the planar surface 2, by chimney like lateral projections 13', or also inclined to above. The cross-section area of both lateral openings 13 correspond essentially to the cross-section area of the heat exchanging channel 11, such that the medium with the part flow 14 (FIG. 7) can be discharged essentially freely and therefore the flow resistance is very small.

The guiding channel 12 of the first stage is connected with the heat exchanging channel 21 of the second stage because the upper wall 17 of the guiding channel 12 is connected via an inclined wall 46 with the limiting wall 26 of the second heat exchanging channel 21. Therewith fresh medium flows with the part flow 24 into the second stage 20 and takes part in heat exchanging action. The second stage 20 is completed in the same manner by an identical guiding plate 29, which leads to lateral openings 23 in the walls 4 and 5, such that at the downstream end of the second stage the part flow 24 can be discharged through these openings 23, wherein also here the sum of the cross-section areas of the openings 25 corresponds to the cross-section area of the second heat exchanging channel 21.

Above of the second heat exchanging channel 21 again a guiding channel 22 is provided, which is formed between the limiting wall 26 and the top wall 27, which runs parallel to the limiting wall 26. The top wall 27 is connected with the wall 18 via an inclined running wall 43, such that the part flow 34 from the first stage 10 and its guiding channel 13 flows into the guiding channel 23 of the second stage 20 and therefrom again via an inclined running wall 47 into the third stage 30, which is formed by the top wall 36 and both sidewalls 4 and 5. At the end of the third stage 30 no guiding plates analogous to the guiding plates 40 and 29 are provided. Instead, the medium flows with the part flow 34 at the downstream end of the third heat exchanging channel 31 through an opening 31. If it is desired to have the discharged air generally in the same direction, it is also possible to provide there in an analogous manner a guiding plate as well as lateral openings analogous to the openings 15 and 25.

FIG. 5 still shows that in the transfer area from the preceding guiding channel to the respective heat exchanging channel 21 or 31 additional guiding plates 41 and 48 may be provided, which run parallel to the inclined running plates 43, 46 and 47. By this a uniform flow is reached and turbulences on the downstream side of the guiding plates 40 and 29 are avoided. It is noted that these plates 41 and 48 may be omitted and therefore, the respective medium can reach downstream of the guiding plates 40, 29 the heat guiding channel of the next stage. The top walls 16 and 26 then end downstream at the guiding plates 40 and 29.

As best can be seen in FIG. 7 the part flows 14 and 24 of used medium can be discharged at the downstream end of the individual heat exchanging channel either laterally through the walls 4 and 5 parallel to the surface 2 (FIG. 5) of the object to be cooled as shown at the openings 23 in FIG. 7, or they can be deflected by guiding chimneys 13', which are mounted laterally to the openings 13 so that the medium is discharged vertically with respect to the surface 2.

Further, it is noted that the form of the guiding plates 40 and 29 can be modified. The preferred variant is the form of an arc of a circle, which best can be seen in FIG. 7 having two arcs of a circle which form in the middle of each respective heat guiding channel an apex dividing the flow. It is also possible to use straight or V-like guiding channels which are arranged symmetrically or asymmetrically. If for certain applications a discharging of used medium is wanted only to one side it is also possible to provide for only one lateral opening in one of both sidewalls 4 and 5, wherein then the respective guiding plate runs inclined through the whole heat exchanging channel. Further, in FIG. 7 a variant is shown where the inclined plate 48 of FIG. 5 is omitted such that the medium flows from the guiding channel 23 on the downstream side of the guiding plate 29 directly into the third heat exchanging channel.

The embodiment of FIG. 6 shows in a perspective view seen inclined from below the heat exchanger according to the invention, wherein here both lateral openings 13 and 23 are connected to chimney-like projections 13' and 23'.

The invention claimed is:

1. A heat exchanger comprising:
a heat exchanging channel having an inlet and an outlet for a medium flowing through the heat exchanging channel,
at least two stages being at least a first stage and a second stage of the heat exchanger arranged sequentially in a flow direction of the medium, each stage having a heat exchanging channel segment such that there is a first heat exchanging channel segment and a second heat exchanging channel segment,
wherein the first stage comprises at least one guiding channel closed by a top wall and arranged parallel to the heat exchanging channel segment of the first stage and wherein flow paths of the at least one guiding channel and of the heat exchanging channel segment in the first stage are in separate planes,
wherein each heat exchanging channel segment has at least one outlet at the end of the respective stage, and
wherein the guiding channel of the first stage is in flow connection with the heat exchanging channel segment of the second stage,
wherein each of the first and second heat exchanging channel segments has at its downstream end a guiding plate for discharging the medium through an opening or openings, which is/are provided within a side wall of the respective heat exchanging channel segment and wherein this discharge is laterally of the heat exchanging channels at the downstream end of the first heat exchanging channel segment and at the downstream end of the second heat exchanging channel segment.

2. The heat exchanger according to claim 1 wherein the stages are connected with each other by plug connections.

3. The heat exchanger according to claim 2 wherein each heat exchanging channel segment has at least one guiding channel and wherein the heat exchanging channel segments and the guiding channels are designed in the form of a cuboid.

4. The heat exchanger according to claim 3 wherein the heat exchanger comprises more than two stages.

5. The heat exchanger according to claim 4 wherein the guiding channels of all stages prior to the last stage are in flow connection with the heat exchanging channel segment of a next stage.

6. The heat exchanger according to claim 4 wherein the heat exchanger comprises a top wall covering all stages, wherein said top wall forms an additional guiding channel, and wherein the outlets of each stages with the exception of the last stage run into said guiding channel formed by the top wall.

7. The heat exchanger according to claim 2 wherein the heat exchanger comprises more than two stages.

8. The heat exchanger according to claim 7 wherein the guiding channels of all stages prior to the last stage are in flow connection with the heat exchanging channel segment of a next stage.

9. The heat exchanger according to claim 1 wherein each heat exchanging channel segment has at least one guiding channel and wherein the heat exchanging channel segments and the guiding channels are designed in the form of a cuboid.

10. The heat exchanger according to claim 1 wherein the individual stages are glued with each other.

11. The heat exchanger according to claim 1 wherein the heat exchanger is manufactured from plastics or metal.

12. The heat exchanger according to claim 1 wherein the heat exchanger comprises more than two stages.

13. The heat exchanger according to claim 12 wherein the guiding channels of all stages prior to the last stage are in flow connection with the heat exchanging channel segment of a next stage.

14. The heat exchanger according to claim 12 wherein the individual stages are designed in a modular manner.

15. The heat exchanger according to claim 1 wherein the heat exchanger comprises said top wall and said top wall covers all stages, wherein said top wall forms an additional guiding channel, and wherein the outlets of each stages with the exception of the last stage run into said guiding channel formed by the top wall.

16. The heat exchanger according to claim 1 wherein a cross-sectional area of the opening or the openings corresponds with the cross-section area of the respective heat exchanging channel segment.

17. The heat exchanger according to claim 1 wherein the guiding plate comprises two brackets, which are connected to each other in an acute manner.

18. The heat exchanger according to claim 17 wherein the brackets of the guiding plates are bent in a curved manner.

19. The heat exchanger according to claim 1 wherein the guiding plate is arranged in a top view mirror-symmetrically to the middle of the heat exchanging channel segment.

20. The heat exchanger according to claim 1 wherein a chimney-like projection is connected to the opening, which projection is arranged to deflect the medium discharged from the opening in such a way that it has at least a medium flowing component vertically to the main flowing direction through the heat exchanger and vertically to the exit direction from the opening.

21. The heat exchanger of claim 1 wherein each stage is connected to an adjacent stage by a cross-flow element in such manner to yield separated part flows of the medium and the cross-flow element is arranged to direct medium from the heat exchanging channel segment of the first stage toward an outlet.

22. The heat exchanger of claim 1 wherein each stage is connected to an adjacent stage by a cross-flow element in such manner to yield separated part flows of the medium and the cross-flow element is arranged to direct medium from the at least one guiding channel of the first stage to the heat exchanging channel segment of the second stage.

23. The heat exchanger of claim 1 wherein each stage is connected to an adjacent stage by a cross-flow element in such manner to yield separated part flows of the medium and the cross-flow element is arranged to direct medium from the heat exchanging channel segment of the first stage toward an outlet, and to direct medium from the at least one guiding channel of the first stage to the heat exchanging channel segment of the second stage.

24. The heat exchanger of claim 1 wherein each stage is connected to an adjacent stage by a cross-flow element in such manner to yield separated part flows of the medium and the cross-flow element comprises an outlet and is arranged to direct medium from the heat exchanging channel segment of the first stage through the outlet, and to direct medium from the at least one guiding channel of the first stage to the heat exchanging channel segment of the second stage.

25. The heat exchanger of claim 1 wherein each stage is connected to an adjacent stage by a cross-flow element in such manner to yield separated part flows of the medium and the cross-flow element is arranged to direct medium from the heat exchanging channel segment of the first stage away from a transfer wall plane of the exchanger, and to direct medium from the at least one guiding channel of the first stage toward the transfer wall plane of the exchanger and to the heat exchanging channel segment of the second stage.

* * * * *